United States Patent [19]

Toth

[11] 3,978,311
[45] Aug. 31, 1976

[54] VOLTAGE SENSOR CIRCUIT FOR AN ARC WELDING WIRE FEED CONTROL

[75] Inventor: Tibor Endre Toth, Florence, S.C.

[73] Assignee: Union Carbide Corporation, New York, N.Y.

[22] Filed: Mar. 26, 1974

[21] Appl. No.: 454,841

[52] U.S. Cl. .............................. 219/131 F; 219/136
[51] Int. Cl.² ........................................... B23K 9/12
[58] Field of Search .... 219/131 F, 131 WR, 131 W, 219/135; 314/64; 250/199

[56] References Cited
UNITED STATES PATENTS

| | | | |
|---|---|---|---|
| 2,223,177 | 11/1940 | Jones | 314/64 |
| 2,636,102 | 4/1953 | Lobosco | 219/131 F |
| 3,258,596 | 6/1966 | Green | 250/199 |
| 3,488,586 | 1/1970 | Watrous et al. | 250/199 |
| 3,604,884 | 9/1971 | Olsson | 219/69 G |
| 3,794,841 | 2/1974 | Consentino et al. | 250/199 |

*Primary Examiner*—J. V. Truhe
*Assistant Examiner*—Clifford C. Shaw
*Attorney, Agent, or Firm*—John R. Doherty

[57] ABSTRACT

A sensor circuit coupled to an arc welding system and responsive to the arc welding voltage including an oscillator and means for varying the frequency thereof in response to the arc voltage, light emitting means responsive to the oscillator frequency, and detecting circuit means responsive to the light emitting means for providing a DC voltage proportional to the arc voltage.

3 Claims, 2 Drawing Figures

VOLTAGE SENSOR CIRCUIT FOR AN ARC WELDING WIRE FEED CONTROL

This invention relates to an arc stabilized wire feed control and solid state arc voltage sensor circuit for monitoring arc voltage fluctuations including means for electrically decoupling the wire feed control from the welding power supply.

In constant current arc welding, compensation for variations in arc voltage is conventionally carried out by adjustment of the electrode wire feed rate. Some prior art wire feed controls sense the arc voltage by a direct coupling across the arc. Such a direct coupling is inherently unsafe due to the fact that conventional wire feed controls operate from a 110 volt or 220 volt line power source, thus subjecting the welding operator to hazardous working conditions. In fact, the only safety precaution taken in most commercially available units is the use of separate ground levels for the welding power supply and wire feed control respectively. Other wire feed controls respond to predetermined changes in the level of arc current in order to provide arc voltage compensation. Controls of the latter type are slow to respond to fluctuations in arc voltage. The wire feed control should be capable of responding quickly to changes in arc voltage without loading down the welding power supply or altering the arc characteristics.

It is therefore the primary object of the present invention to provide an arc voltage sensing circuit for monitoring arc voltage fluctuations across a constant current arc and which is responsive to the magnitude of the arc voltage variation.

It is a further object to provide a wire feed control system incorporating an arc voltage sensing circuit which is electrically isolated from the welding power supply circuit, responds quickly to arc voltage changes and provides a signal proportional to the arc voltage fluctuation.

Other objects and advantages of the present invention will become apparent from the following detailed description of the invention when taken in connection with the accompanying drawings of which:

Figure 1:
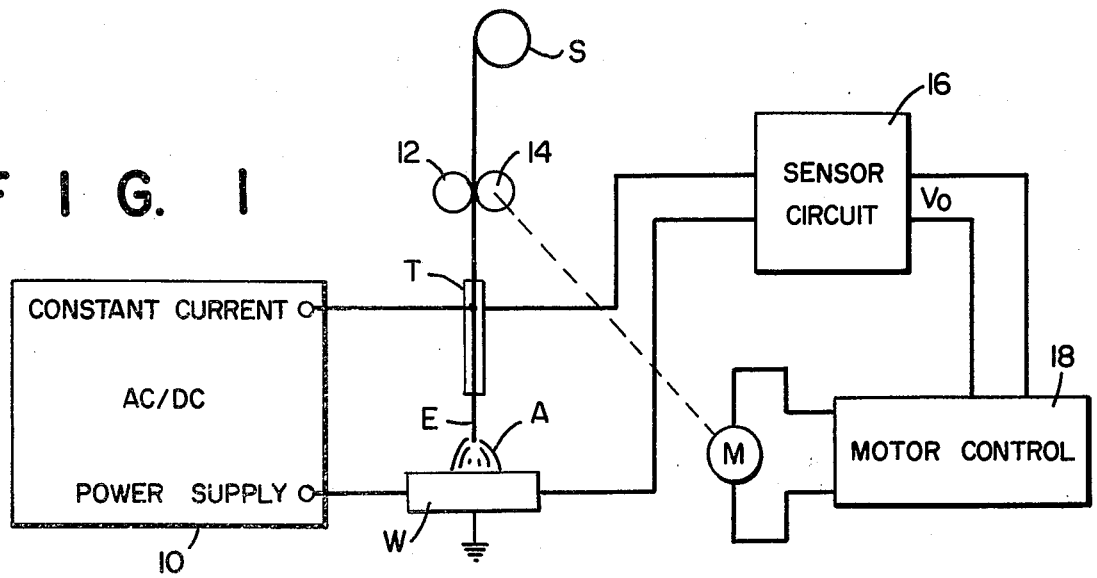
FIG. 1 is a block diagram of a constant current arc welding set up in combination with the wire feed control of the present invention.

The constant current welding system shown in FIG. 1 comprises a conventional welding constant current power supply 10 which provides either AC or DC output power respectively across the torch T to workpiece W. The workpiece W is usually at ground potential. Torch T is a conventional consumable electrode welding torch adapted to direct the electrode E to the workpiece W under the operation and control of a welding operator. An arc A is established between the electrode E and the workpiece W in a conventional manner such as by inching the electrode into physical contact with the workpiece W. The arc A is shielded from atmospheric air by a substantially inert gas fed in a conventional manner through the torch T. The consumable electrode E is drawn through a pair of feed rolls 12 and 14 respectively, from a supply spool S, and at a feed rate determined by the speed of motor M.

A change in voltage across the arc A, which may occur, for example, by a variation in arc length due to a vertical movement of the torch T, will for any given feed rate, cause a corresponding change in the wire melt off rate which, if left uncorrected, may result in the arc stubbing out or cause burn back. Hence, it is necessary to compensate for variations in arc length in order to restore equilibrium to the system. The preferred system of regulation involves adjusting the wire feed rate in response to arc voltage changes. An arc sensor circuit 16 senses the arc voltage and provides an output DC voltage Vo which is both proportional to the instantaneous level of the arc voltage and electrically isolated from the welding system. The output DC voltage Vo is applied to the motor speed control 18 which determines the speed of motor M and in turn the accompanying wire feed rate. Thus the wire feed rate is regulated in response to arc voltage variations. Although any conventional motor speed control circuit 18 may be used, the motor speed control shown and described in U.S. Pat. No. 3,781,620 entitled Full Wave Governor Control System which issued on Dec. 25, 1973 in the name of T. E. Toth, is preferred.

Figure 2:
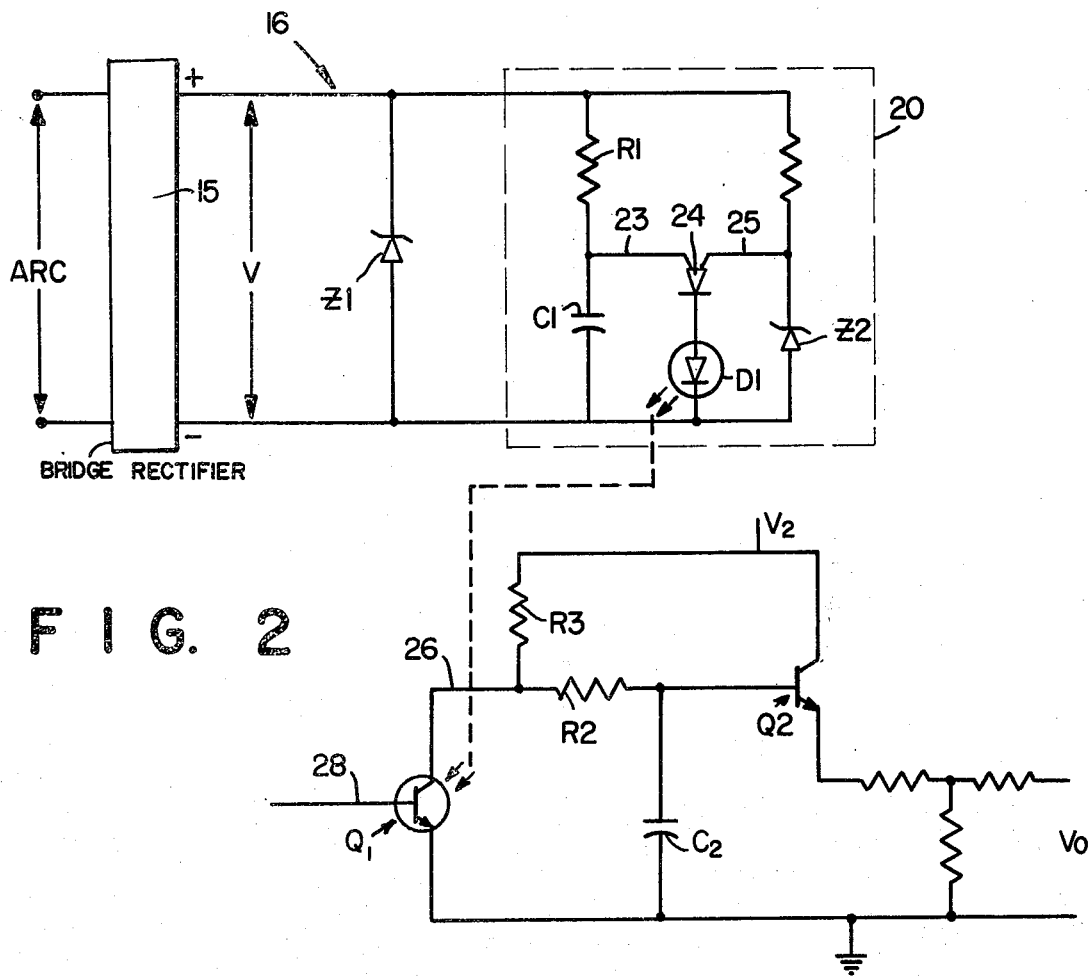
FIG. 2 is an electrical schematic of the voltage isolation circuit of FIG. 1.

The voltage sensor circuit 16 of FIG. 1, is schematically illustrated in FIG. 2 and includes a full wave bridge rectifier circuit 15 for use when the power supply 10 is operated in the AC mode so as to convert the AC arc voltage into a DC signal. For DC power supply operation the bridge circuit 15 is unnecessary. A zenor diode Z1 is connected across the output of the bridge rectifier 15 to limit the detected arc voltage V to a predetermined maximum level in order to place an upper limit on the wire feed rate. Under ordinary operating circumstances the arc voltage will be substantially below such predetermined maximum level. The voltage V, developed across the zenor diode Z1 is applied to a voltage controlled oscillator circuit 20. Oscillator circuit 20 is of the relaxation type whose frequency is controlled by the RC time constant of resistor R1 and capacitor C1 and the level of applied voltage V. Capacitor C1 charges to a voltage during each cycle of oscillation equal to the voltage across zenor diode Z2 plus about 0.7 volts at which level the programable unijunction transistor (PUT) 24 fires. With the time constant RC fixed the programmed firing level is reached in each oscillating cycle at a time which varies directly with changes in the applied voltage V. The programable unijunction transistor (PUT) 24 is a commercially available solid state negative impedance device having a controlled firing potential which is preset by setting a predetermined voltage at its gate 25. For the circuit shown in FIG. 2, the gate 25 is set by an appropriate selection of zenor diode Z2. When the potential across capacitor C1, representing the potential at the anode 23 of the programmed unijunction transistor 24, reaches the potential set at gate 25 plus the junction voltage of about 0.7 volts, programmed unijunction transistor 24 fires discharging capacitor C1 through the light emitting diode D1. As soon as the capacitor C1 is fully discharged the programmed unijunction transistor 24 turns off, providing a high impedance into capacitor C1. Capacitor C1 then once again begins to charge. As long as the voltage V impressed across the oscillator 20 remains constant the frequency of the oscillator 20 will not vary. Any change however in voltage V will cause a corresponding change in the oscillator frequency. Thus the frequency of oscillator 20 is directly proportional to voltage V and thus to the arc voltage.

Light emitting diode D1, as its name implies, emits a pulse of light in response to each pulse of energy delivered from capacitor C1 during each cycle of oscillation. The light emitting diode D1 is photocoupled to the light detecting transistor Q1. The light emitting diode D1 is a conventional device and is commercially sold in combination with a light detecting transistor such as Q1. The output at the collector terminal 26 of light detecting transistor Q1 is connected to an integrating circuit consisting of resistor R2 and capacitor C2. Each time a pulse of light is received at the base terminal 28 of transistor Q1, the transistor is enabled dropping the potential at the collector terminal 26 to ground potential. This provides a momentary discharge path for capacitor C2 lowering the potential to which it is otherwise charged through resistors R2 and R3 from the supply V2. The higher the frequency of the light pulses from photodiode D1, the lower the level of potential across capacitor C2. Thus, the frequency of oscillator 20 will establish a corresponding light emission pulse rate which in turn determines the potential across capacitor C2. A DC voltage Vo proportional to the potential across capacitor C2 is developed at the output of the sensor circuit 16 and applied to the motor speed control circuit 18 for establishing an electrode E feed rate which corresponds to the magnitude of voltage Vo.

In operation, a variation in the frequency of oscillator 20 will produce a corresponding increase or decrease respectively in the light pulse rate generated from the photodiode D1. This results in a corresponding variation in the switching rate of light detecting transistor Q1 which causes an inversely proportional increase or decrease in the voltage level across capacitor C2 which is reflected in turn by a corresponding increase or decrease respectively in the DC output level Vo. A change in the output level Vo causes a corresponding and predetermined adjustment in the wire feed rate. The frequency of oscillator 20 is directly proportional to variations in the arc voltage and the wire feed rate varies in an inverse relationship with changes in the voltage level Vo. Hence, an increase in arc voltage results in a predetermined increase in wire speed which tends to decrease the arc voltage and restore equilibrium.

What I claim is:

1. A wire feed control for regulating the speed at which a consumable electrode is fed into an arc established between said electrode and a workpiece from a source of constant welding current in response to variations in the arc voltage, comprising: an electrode feed motor, electrode feed means engaging said electrode and responsive to said motor, a motor governor for controllably energizing said motor and a sensor circuit, said circuit comprising, in combination, means for rectifying said arc voltage; an oscillator; means for varying the oscillator frequency in response to changes in the magnitude of said rectified arc voltage; means electrically coupled to said oscillator for emitting pulses of light at a rate proportional to said oscillator frequency; means for detecting said light pulses and an integrating network coupled to said detecting means and comprising a resistor and capacitor in series, the arrangement being such that any variation in the rate of detected light pulses from a predetermined value causes an inversely proportional change in the voltage level across said capacitor to thereby produce a varying DC output signal which is proportional to said voltage change and which is applied to said motor governor in order to vary the wire feed rate in response to variations in said arc voltage.

2. A control as defined in claim 1 wherein said means for emitting pulses of light is a light emitting diode in circuit with said oscillator for generating a pulse of light in synchronism with each cycle of oscillation.

3. A control as defined in claim 1 wherein said detecting means is a light responsive transistor and wherein said integrating network is electrically connected across said transistor.

* * * * *